(12) United States Patent
Farnworth et al.

(10) Patent No.: US 6,242,103 B1
(45) Date of Patent: *Jun. 5, 2001

(54) METHOD FOR PRODUCING LAMINATED FILM/METAL STRUCTURES

(75) Inventors: Warren M. Farnworth, Nampa; David R. Hembree, Boise, both of ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 09/301,279

(22) Filed: Apr. 28, 1999

Related U.S. Application Data

(60) Continuation of application No. 08/898,099, filed on Jul. 22, 1997, now Pat. No. 5,949,141, which is a division of application No. 08/577,187, filed on Dec. 22, 1995, now Pat. No. 5,776,824.

(51) Int. Cl.$^7$ .................................................. H01L 23/48
(52) U.S. Cl. ......................... 428/458; 428/901; 174/255; 174/257; 257/780
(58) Field of Search .................................. 428/209, 458, 428/901; 257/780; 174/255, 257

(56) References Cited

U.S. PATENT DOCUMENTS

| | | |
|---|---|---|
| 4,878,990 | 11/1989 | Dugan et al. |
| 5,231,051 | 7/1993 | Baldi et al. ............................ 437/187 |
| 5,250,469 | 10/1993 | Tanaka et al. ........................ 437/209 |
| 5,367,253 | 11/1994 | Wood et al. ......................... 324/158.1 |
| 5,397,997 * | 3/1995 | Tuckerman et al. .................... 324/754 |
| 5,529,504 | 6/1996 | Greenstein et al. .................... 439/91 |
| 5,541,524 * | 7/1996 | Tuckerman et al. .................... 324/754 |
| 5,550,407 | 8/1996 | Ogashiwa ............................... 257/735 |
| 5,575,662 | 11/1996 | Yamamoto et al. ..................... 439/67 |
| 5,873,161 * | 2/1999 | Chen et al. ............................. 29/830 |
| 5,949,141 * | 9/1999 | Farnworth et al. .................... 257/780 |
| 6,005,292 * | 12/1999 | Roldan et al. ......................... 257/777 |

FOREIGN PATENT DOCUMENTS

| | | |
|---|---|---|
| 0 165 626 | 12/1985 | (EP) . |
| 3-133136 | 6/1991 | (JP) . |

OTHER PUBLICATIONS

"Bump Tape Connector". IBM Technical Disclosure Bulletin. vol. 36, No. 09B. Sep. 1993.

* cited by examiner

*Primary Examiner*—Cathy Lam
(74) *Attorney, Agent, or Firm*—Traskbritt

(57) ABSTRACT

A process for producing laminated film/metal structures comprising bumped circuit traces on a non-conductive substrate wherein a copper sheet/polyimide film laminate is coated with resist on the exterior surfaces. The resist adjacent the polyimide film is selectively exposed and etched to expose an area of the polyimide film. The exposed polyimide film is etched to form vias through the polyimide film to the inner side of the copper sheet. The resist adjacent the polyimide film is stripped away and a metal bump is electrolytically plated through each via onto the copper sheet. A subsequent layer of resist is electrophoretically applied over the bumps. The resist material adjacent the copper sheet is then selectively exposed and etched to expose areas of the copper sheet. The exposed copper sheet is etched to form circuit traces and the remaining resist adjacent both the polyimide film and the copper sheet is stripped away.

11 Claims, 4 Drawing Sheets

METHOD FOR PRODUCING LAMINATED FILM/METAL STRUCTURES

CROSS REFERENCE TO RELATED APPLICATION

This application is a continuation of application Ser. No. 08/898,099, filed Jul. 22, 1997, now U.S. Pat. No. 5,949,141, issued Sep. 7, 1999, which is a divisional of application Ser. No. 08/577,187, filed Dec. 22, 1995, now U.S. Pat. No. 5,776,824, issued Jul. 7, 1998.

BACKGROUND OF THE INVENTION

1. Field of the Invention

The present invention relates to an improved process for the fabrication of circuit traces having contacts to improve contact dimensional quality and to reduce waste or "thiefage" of conductor material without increasing fabrication process complexity. More particularly, the improved process is suitable for fabrication of circuits including raised bump-type contacts for use in the testing, "burn-in" and characterization of semiconductor dies prior to permanent packaging.

2. State of the Art

Burn-in is a reliability test of a semiconductor device or, as referenced herein, of a die, including a plurality of such devices, to identify physical and electrical defects which would cause the die to fail to perform to specifications or to fail altogether before its normal life cycle is completed. Thus, the die is subjected to an initial heavy duty cycle which elicits latent silicon defects. The typical burn-in process consists of biasing the die against a circuit board or burn-in die substrate, wherein the die under test (DUT) is subjected to an elevated voltage load while in an oven at temperatures of between about 125–150° C. for approximately 24–48 hours. It is desirable to not only conduct a burn-in test but to fully characterize the performance characteristics of a die prior to assembly and packaging. This is particularly desirable in the case of multi-die assemblies, or so-called multi-chip modules ("MCM's").

Test packages to receive individual dies and which permit all of the above-referenced types of testing are disclosed in U.S. Pat. No. 5,367,253 (the "'253 patent"), assigned to the assignee of the present invention and incorporated herein by this reference. The test packages of the '253 patent include intermediate substrates or boards interposed between the DUT and the test package itself. Such intermediate substrates afford the opportunity to test dice having different bond pad configurations, and to replace such substrates when the circuit traces thereon fail or are damaged or the bump-type contacts at the die ends of the circuit traces wear, deform or are otherwise damaged.

The prior art process for fabricating a flexible intermediate substrate of the type employed in burn-in test packages begins with a sheet of polyimide film 20, such as Kapton™, laminated to a sheet of copper foil 22 (see FIG. 2A). The exterior surfaces of both the polyimide film 20 and the copper foil 22 are coated with an appropriate resist material to form a polyimide-side resist 24 and a cooper-side resist 26 (FIG. 2B). The copper-side resist 26 is exposed with a superimposed mask and then etched to reveal the external surface of the copper foil 22 (FIG. 2C). The exposed portions of the copper foil 22 are then etched to define circuit traces 12 for the KGD intermediate test substrate (FIG. 2D), the circuit traces extending at their outer ends through necked-down tie bars 16 to a bus bar 14 (see FIG. 3). The remaining copper-side resist 26 is then stripped away and a second coat of copper-side resist material 27 is applied to again cover the entire exterior surface of the copper foil with KGD circuit traces 12 (FIG. 2E). The polyimide-side resist 24 is then exposed through a suitable mask and subsequently etched to selectively expose the polyimide film 20 (FIG. 2F). The polyimide film 20 is then itself etched to produce round vias 30 through the polyimide film 20 to the adjacent, inner surface of the circuit traces 12 (FIG. 2G). The locations of the vias 30 at the die ends of the circuit traces 12 correspond to the locations of the bond pads of the semiconductor die to be tested. The polyimide-side resist 24 is then stripped away (FIG. 2H) and a metal bump 32 is electrolytically plated through the polyimide via 30 onto the circuit traces 12 (FIG. 2I). The second copper-side resist material 27 is then stripped off to produce the substrate with bumped circuit traces (FIG. 2I).

However, as shown in FIG. 3, the prior art process of electrolytically plating the metal bumps 10 on the copper circuit traces 12 laminated to a sheet of polyimide film 20 requires a copper bus bar 14 comprising a cathode and tie bars 16 for completing a circuit to previously-formed circuit traces 12 for the deposition of bump 32 on the ends of the circuit traces 12 submerged in the plating solution. Thus, while necessary for forming bumps or contacts 10, the copper bus bar 14 and tie bars 16 must be removed by cutting along kerf line 18.

The copper bus bar 14 comprises a considerable amount of copper material which requires a recycling process if the copper is to be recovered. Furthermore, removal of the copper bus bar 14 is an extra and unwanted circuit fabrication step. Moreover, because the tie bars 16 are generally non-uniform in cross-sectional area, different current densities are experienced at the bump ends of the copper traces 12. The differences in current densities on each copper trace 12 result in the plated bumps 10 becoming non-uniform in diameter and thus height for a given plating time. The differences in bump diameter and height make uniform contact with the bond pads on a semiconductor die to be tested much more difficult. In general, as disclosed in the '253 patent, the connection between the semiconductor die and the test package is non-permanent, wherein the die is biased against the bump-like contacts with a spring or the like such that the bond pads on the semiconductor die contact the plated bumps 10. Thus, even minor variations between the plated bump 10 heights may result in one or more die bond pads failing to make contact with one or more plated bumps 10. This lack of contact will result in a portion of semiconductor die not being under a voltage load during the burn-in process and prohibits complete electrical testing and characterization of the die. As a result, if a latent silicon defect exists in this portion of the semiconductor device, the burn-in process will not detect the defect. In addition to the foregoing problem, it should be recognized that in many instances, the bond pads of the die are recessed below the surface level of a passivation layer on the active surface of the die to protect circuitry thereon. With the variations in height and diameter of existing bump-type contacts 10, it is difficult to mate the die and KGD traces electrically through bumps 10 without damaging the bond pads through application of excessive biasing force or damaging the passivation layer adjacent the bond pad periphery as the die is forced into contact with the varying diameter and height bumps.

Therefore, it would be advantageous to develop a process which forms plated bumps which are uniform in height and diameter. Further, it would be advantageous to develop a process which reduces the cost per circuit trace by the elimination of inherent material thiefage caused by the need for a bus bar and tie bars. Finally, another advantage is the elimination of the additional process step of removing the bus bar by sawing through the tie bars 16 to release the copper circuit traces 12 on polyimide film 20.

SUMMARY OF THE INVENTION

The present invention relates to an improved process sequence for the fabrication of bumped circuit traces for use in burn-in and testing of semiconductor dies for qualification prior to packaging. The process of the invention reduces material thiefage and eliminates uneven current density and plating problems causing non-uniform plated contact bumps without increasing the process complexity.

The process of the invention enables the fabricator to employ the entire sheet of conductive material as a cathode during the bump plating process, thus eliminating variations in current density which would produce bumps of different height and size. Moreover, the process eliminates the use of the prior art bus bar and tie bars at the outer edge of the traces, conserving copper and eliminating post-plating sawing or kerfing of the tie bars.

The improved process begins with a sheet of polyimide or other suitable polymer film, such as a polyimide silicone, laminated to a sheet of copper foil or other suitable metal. The exterior surfaces of both the polyimide film and the copper foil are coated with appropriate resist materials, as known in the art. The polyimide-side resist is then exposed and etched to expose the polyimide film. The polyimide film is etched to produce round vias through the polyimide film to the copper foil. The polyimide-side resist is stripped away and a metal bump is electrolytically plated through the via in the polyimide film to make electrical contact with the copper foil. Since the metal bump is formed while the copper foil is still in a sheet form, the copper foil provides a uniform current intensity which results in a uniform bump size for each bump on the polyimide film/copper foil laminate. Preferably, the metal bumps are formed of either a non-porous nickel or palladium. Softer metals, such as gold, are not suitable because the semiconductor die bond pads might inadvertently bond to the metal bumps during the burn-in process.

After bump formation, a second resist material is applied to cover the bumps and again cover the polyimide film. The preferred resist material is an electrophoretic resist, such resists and the process for their application being known in the circuit board fabrication art but heretofore not applied to the purposes of the present invention or recognized as having such applicability or utility.

After the electrophoretic resist material is applied to cover the plated bumps (such resists only covering conductive surfaces), the copper-side resist is exposed through a mask and selectively etched to reveal the external surface of the copper foil. The uncoated copper foil is then etched to produce the KGD circuit traces. The remaining resist material is then stripped away from both the copper and polyimide sides, thereby forming the finished product of bumped circuit traces on the polymer film.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PREFERRED EMBODIMENT

Figure 1A:
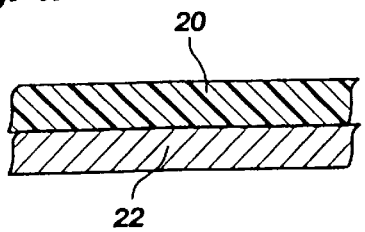
FIGS. 1A through 1J illustrate side elevational, cross-sectional views depicting the steps of the process of the present invention.
Figure 1B:
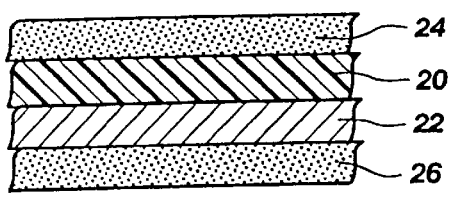
Figure 1C:
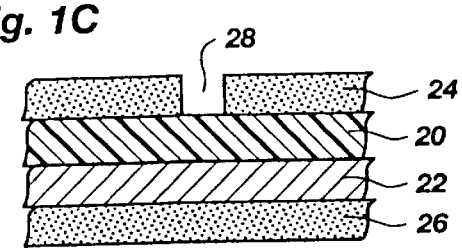
Figure 1D:
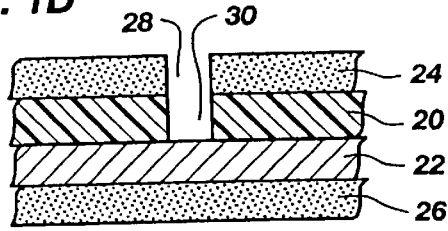
Figure 1E:
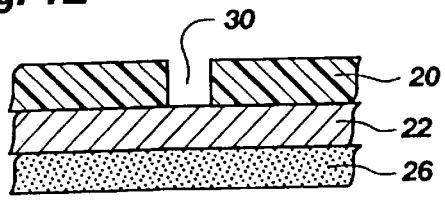
Figure 1F:
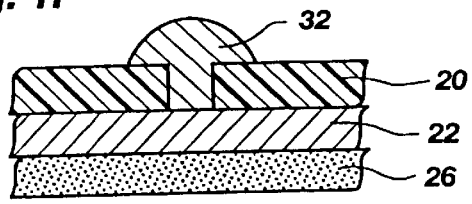

FIGS. 1A through 1J illustrate the process of the present invention. FIG. 1A shows the starting workpiece material of a sheet of polyimide or other suitable film 20 laminated to a copper foil 22. The exterior surfaces of both the polyimide film 20 and the copper foil 22 are coated with appropriate photosensitive resist materials known in the art to form a polyimide-side positive tone resist 24 and a copper-side negative tone resist 26 (FIG. 1B). The resists may be applied by spin-on or other techniques known in the art. The polyimide-side resist 24 is then exposed through a mask and etched to expose an area 28 of polyimide film 20 (FIG. 1C). The polyimide film 20 is etched to produce a plurality of round vias 30 through the polyimide film 20 to the underside or inner side of copper foil 22 (FIG. 1D).

Figure 1G:
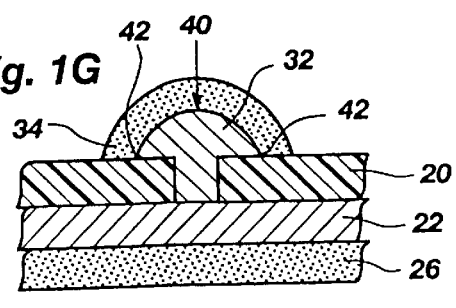

The polyimide-side resist 24 is then stripped away (FIG. 1E) (the negative tone copper-side resist 26 remaining) and metal bumps 32 (corresponding to previously-described bumps 10) are electrolytically plated through the polyimide via 30 on copper foil 22 (FIG. 1F) wherein the entire copper foil sheet acts as the cathode for the electrolytic plating process. An electrophoretically applied resist material 34 is then applied to cover the bumps 32 (FIG. 1G). Electrophoretic resist materials are offered commercially by the Shipley Company.

Figure 1H:
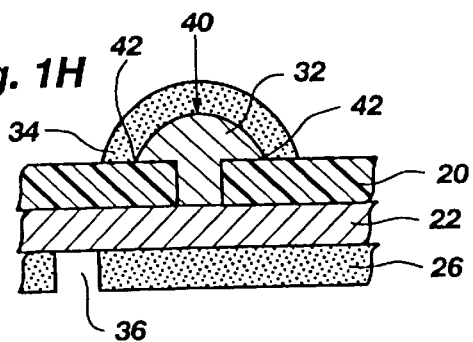
Figure 1I:
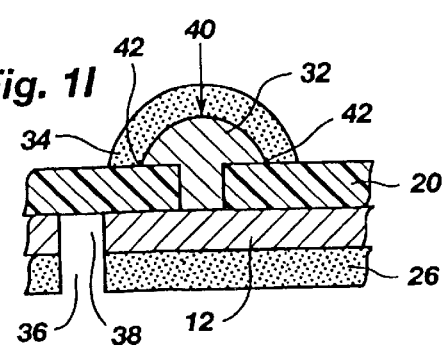
Figure 1J:
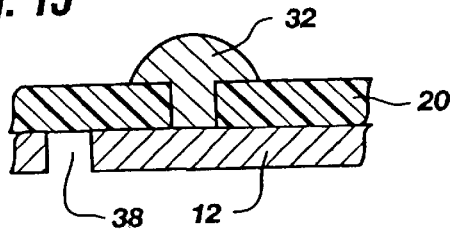
Figure 2A:
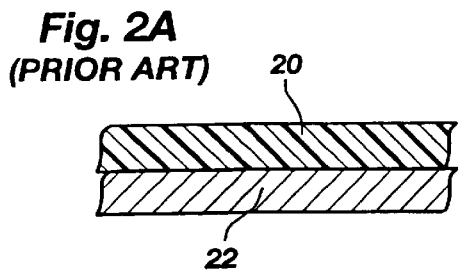
FIGS. 2A through 2J illustrate side elevational, cross-sectional views depicting the steps of the prior art process employed in forming KGD circuit traces.
Figure 2B:
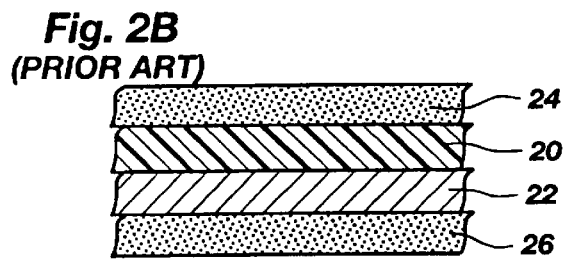
Figure 2C:
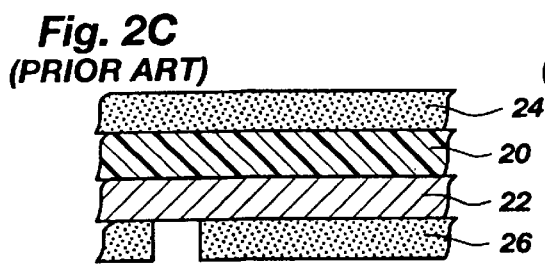
Figure 2D:
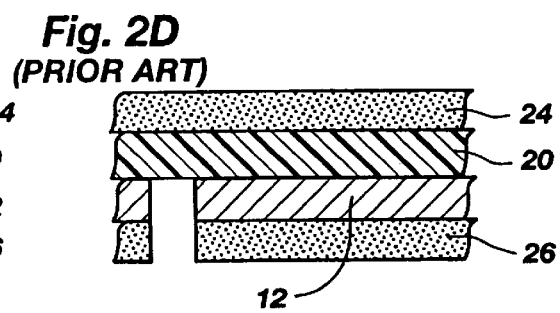
Figure 2E:
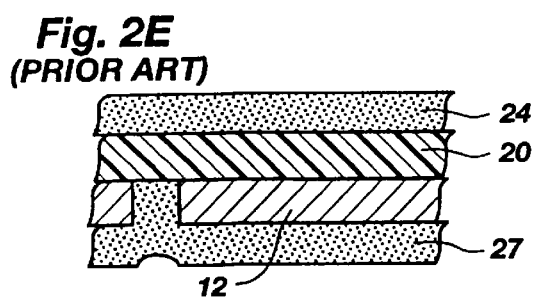
Figure 2F:
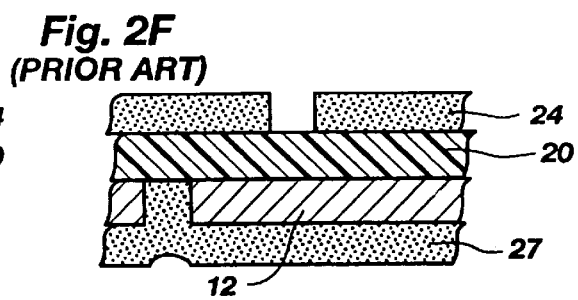
Figure 2G:
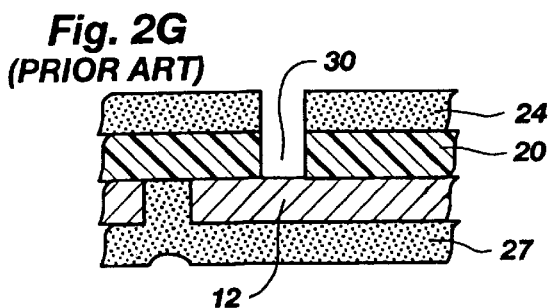
Figure 2H:
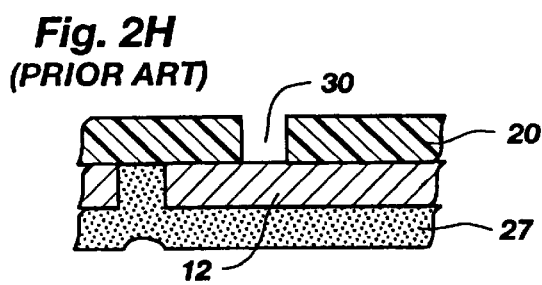
Figure 2I:
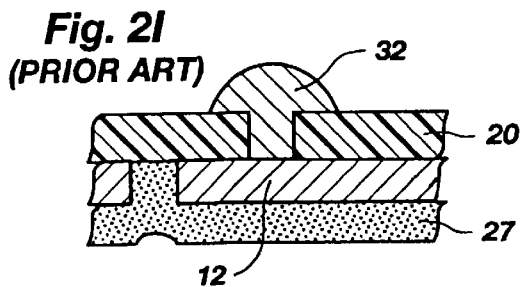
Figure 2J:
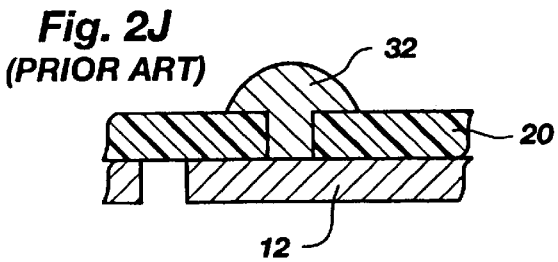
Figure 3:
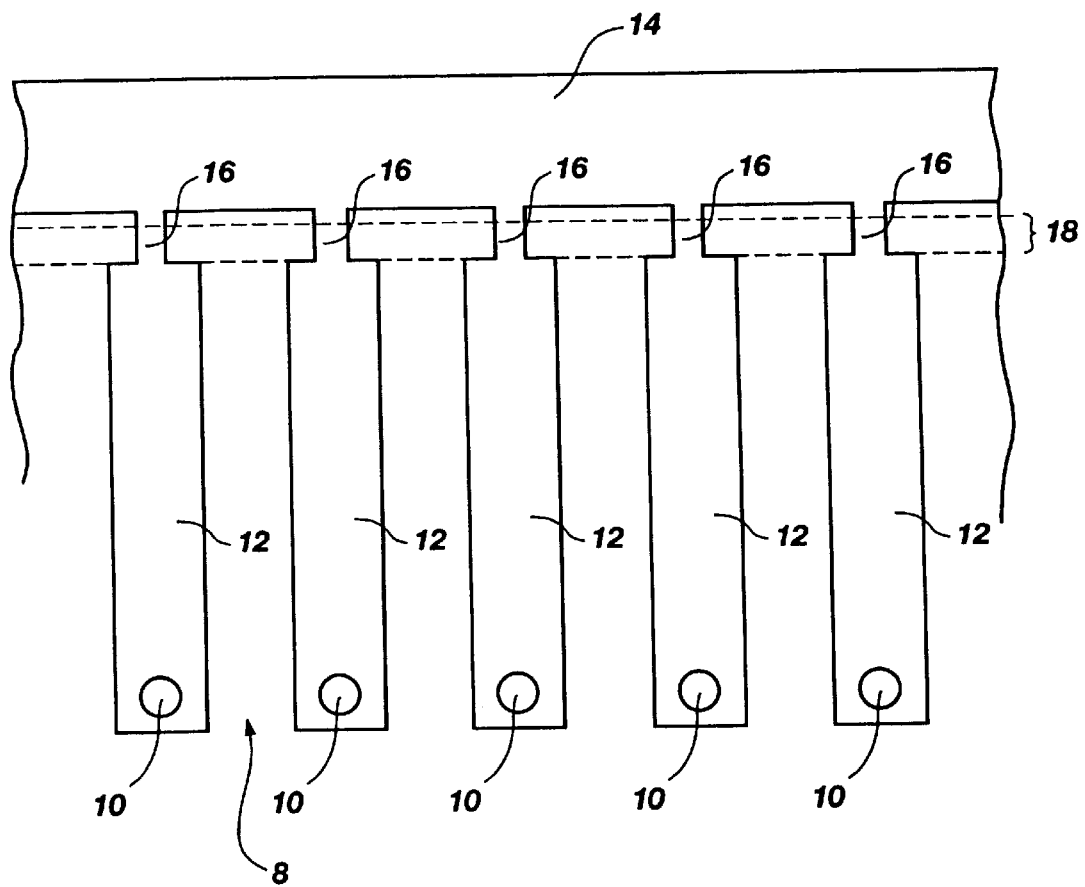
FIG. 3 is a top view of KGD circuit traces produced by standard techniques prior to the removal of the copper bus bar and tie bars connecting the traces to the bus bar.

The copper-side resist 26 is then exposed through a suitable mask and etched to expose an area 36 of the outer or external surface of the copper foil 22 (FIG. 1H). The copper foil 22 is then etched 38 at the exposed external surface of the copper foil 22 to produced the KGD circuit traces 12 (FIG. 1I). The remaining resist material 34 and copper-side 26 resist material are then stripped away, thereby forming the finished product of circuit traces 12 on polyimide film 20 (FIG. 1J).

The electrophoretic process has numerous advantages in the practice of the present invention. For example, an electrophoretic resist only coats electrically conductive surfaces (e.g., the bumps), is extremely topographically tolerant and inherently self-thickness controlling, is extremely fast (the resist may be applied in about three seconds in a plating bath), and is self-limiting, wherein once the conductive surfaces are coated, the resist coating process stops. The thickness of the resist layer in the electrophoretic process is inversely related to temperature. Therefore, the higher the temperature in the plating bath, the thinner the resist layer. Thus, a further advantage of the electrophoretic process is the ability to achieve a consistent desired thickness through the monitoring and controlling of the temperature in the plating bath.

The topographic tolerance and inherent self-control of the electrophoretic process allows the application of the resist material over the crown 40 and periphery 42 of each plated bump to be the same thickness, unlike a normal resist process where there are wide variations in the resist material thickness at corners, peaks and valleys of the workpiece in comparison to the thickness on substantially planar surfaces. The prior art resists sometimes inadequately coat corners and peaks, while valleys may be coated to a degree of thickness much greater than that which is required, wasting resist material. Thus, in a state-of-the-art resist process, in order to coat workpiece corners and peaks effectively, it is necessary to put substantially more resist material in other areas, such as the valleys and major planar surfaces, in order to get an adequate amount of resist material on all of the surfaces to be coated. In terms of the inventive process, application of an electrophoretic resist ensures that both the tops or crowns 40 of the bumps 32 and the edges or periphery 42 of the bumps 32 adjacent polyimide film 20 are equally coated, and thus equally protected, during the subsequent foil etching process. As a result, the dimensional stability of the bumps 32 is maintained.

Figure 4:
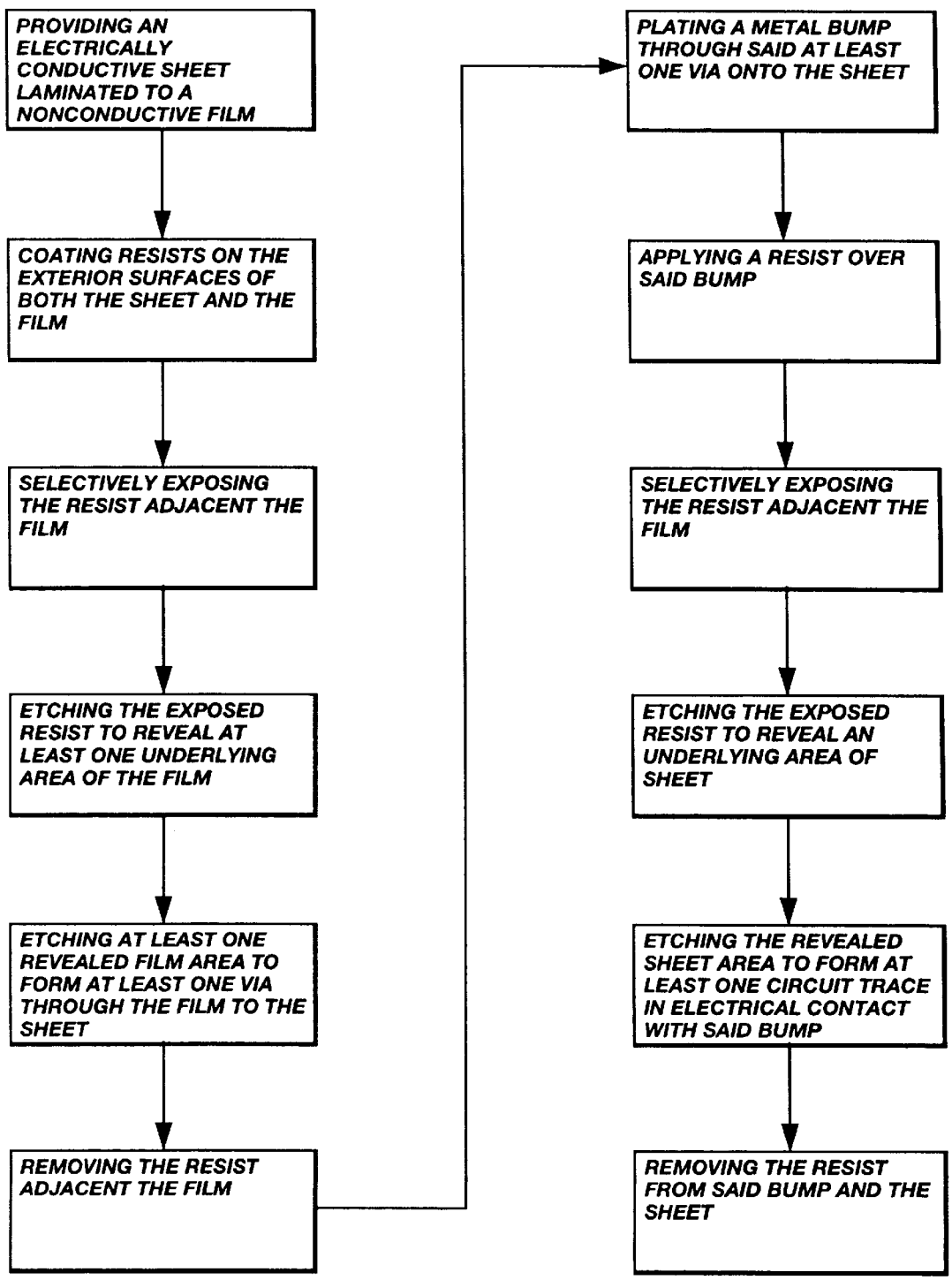
FIG. 4 is a block diagram of the plating process of the present invention.

A block diagram of the process of the present invention is illustrated in FIG. 4 wherein: an electrically conductive sheet laminated to a nonconductive film is provided; resists are coated on the exterior surfaces of both the sheet and the film; the resist adjacent the film is selectively exposed; the exposed resist is etched to reveal at least one underlying area of the film; at least one revealed film area is etched to form at least one via through the film to the sheet; the resist adjacent the film is removed; a metal bump is plated through said at least one via onto the sheet; a resist is applied over said bump; the resist adjacent the sheet is selectively exposed; the exposed resist is etched to reveal an underlying area of sheet; the revealed sheet area is etched to form at least one circuit trace in electrical contact with said bump; and the resist is removed from said bump and the sheet.

Having thus described in detail preferred embodiments of the present invention, it is to be understood that the invention defined by the appended claims is not to be limited by particular details set forth in the above description as many apparent variations thereof are possible without departing from the spirit or scope thereof.

What is claimed is:

1. A substrate for semiconductor die testing applications, comprising:

a nonconductive film;

a plurality of circuit traces on one side of said nonconductive film; and a plurality of contact bumps on a side of said nonconductive film opposite that on which said plurality of circuit traces are located, wherein said plurality of contact bumps are configured as one of said plurality of-contact bumps per one of said plurality of circuit traces, and wherein all of said plurality of contact bumps are of identical height above said nonconductive film and are of identical size and configuration.

2. The substrate of claim 1, wherein said nonconductive film comprises a polymer.

3. The substrate of claim 1, wherein said plurality of circuit traces comprise copper.

4. The substrate of claim 1, wherein said plurality of contact bumps comprises non-porous nickel.

5. The substrate of claim 1, wherein said plurality of contact bumps comprises non-porous palladium.

6. An intermediate substrate structure comprising:

a nonconductive film laminated to a sheet of conductive material;

said nonconductive film having a plurality of vias extending therethrough to expose a surface of said sheet of conductive material at a bottom surface of said plurality of vias;

said sheet of conductive material formed to provide a uniform current intensity during electrolytic formation of contact bumps at locations of said plurality of vias; and a plurality of dimensionally uniform contact bumps extending through said plurality of vias making electrical contact with said sheet of conductive material.

7. The intermediate substrate structure of claim 6, wherein said plurality of dimensionally uniform contact bumps are of substantially identical height above said nonconductive film.

8. The intermediate substrate structure of claim 6, wherein said nonconductive film comprises a polymer, and said sheet of conductive material comprises copper.

9. The intermediate substrate structure of claim 6, wherein said plurality of dimensionally uniform contact bumps comprises non-porous nickel.

10. The intermediate substrate structure of claim 6, wherein said plurality of dimensionally uniform contact bumps comprises non-porous palladium.

11. A substrate for semiconductor device burn-in applications, comprising:

a nonconductive film;

a plurality of circuit traces on one side of said nonconductive film; and a plurality of contact bumps on a side of said nonconductive film opposite that on which said plurality of circuit traces are located, said plurality of contact bumps formed of a metal selected from the group consisting of non-porous nickel and non-porous palladium, wherein said plurality of contact bumps are configured as one of said plurality of contact bumps per one of said plurality of circuit traces, and wherein all of said plurality of contact bumps are of substantially identical height above said nonconductive film and are of substantially identical size and configuration.

* * * * *

UNITED STATES PATENT AND TRADEMARK OFFICE
CERTIFICATE OF CORRECTION

PATENT NO.   : 6,242,103 B1
DATED        : June 5, 2001
INVENTOR(S)  : Warren M. Farnworth and David R. Hembree It is certified that error appears in the above-identified patent and that said Letters Patent is hereby corrected as shown below:

Title page,
Item [56], References Cited, U.S. PATENT DOCUMENTS, after "Dugan et al.", add class and sub-class -- 156/630 --; and "Ogashiwa" change sub-class, "735" to -- 738 --
Item [74], *Attorney, Agent, or Firm*, change "Traskbritt" to -- TraskBritt --

Column 2,
Line 17, change "2I" to -- 2J --
Line 47, change "falling" to -- failing --

Column 3,
Line 11, change "bum" to -- burn --

Column 4,
Line 44, change "produced" to -- produce --

Column 5,
Line 51, remove hyphen between "of" and "contact"

Signed and Sealed this

Sixteenth Day of March, 2004

JON W. DUDAS
*Acting Director of the United States Patent and Trademark Office*